(12) United States Patent
McCurdy

(10) Patent No.: US 9,137,915 B2
(45) Date of Patent: Sep. 15, 2015

(54) PROTECTIVE CASE FOR ELECTRONIC DEVICES

(71) Applicant: Andrew P. McCurdy, Bonita Springs, FL (US)

(72) Inventor: Andrew P. McCurdy, Bonita Springs, FL (US)

( * ) Notice: Subject to any disclaimer, the term of this patent is extended or adjusted under 35 U.S.C. 154(b) by 10 days.

(21) Appl. No.: 14/276,366

(22) Filed: May 13, 2014

(65) Prior Publication Data

US 2014/0299488 A1 Oct. 9, 2014

Related U.S. Application Data

(63) Continuation-in-part of application No. 13/943,917, filed on Jul. 17, 2013, which is a continuation-in-part of application No. 13/135,287, filed on Jul. 1, 2011, now Pat. No. 8,676,279.

(51) Int. Cl.
| | |
|---|---|
| *A45F 5/00* | (2006.01) |
| *H05K 5/03* | (2006.01) |
| *A45C 13/00* | (2006.01) |
| *A45F 5/02* | (2006.01) |
| *A45C 11/00* | (2006.01) |

(52) U.S. Cl.
CPC ............... *H05K 5/03* (2013.01); *A45C 13/002* (2013.01); *A45F 5/00* (2013.01); *A45F 5/021* (2013.01); *A45C 2011/002* (2013.01); *A45F 2005/008* (2013.01); *A45F 2200/0508* (2013.01); *A45F 2200/0516* (2013.01)

(58) Field of Classification Search
CPC ................. A45F 2200/0516; A45C 2011/002
USPC ......... 224/197–200, 217, 218, 219, 221, 930; 206/320; 361/679.59; 248/688
See application file for complete search history.

(56) References Cited

U.S. PATENT DOCUMENTS

| | | | | |
|---|---|---|---|---|
| D414,925 | S | * | 10/1999 | Holland ......................... D3/218 |
| 7,286,803 | B2 | | 10/2007 | Hamasaki et al. |
| 7,327,841 | B2 | | 2/2008 | Schreiber et al. |
| D642,579 | S | | 8/2011 | Deutsch et al. |
| 8,328,055 | B1 | | 12/2012 | Snyder |
| 8,499,933 | B2 | * | 8/2013 | Ziemba ........................ 206/320 |
| 8,631,934 | B2 | * | 1/2014 | Chun ............................ 206/320 |
| 8,676,279 | B2 | * | 3/2014 | McCurdy .................. 455/575.6 |
| 8,833,379 | B1 | * | 9/2014 | Kaplan ........................ 132/287 |

(Continued)

FOREIGN PATENT DOCUMENTS

FR 2812993 2/2002

OTHER PUBLICATIONS

U.S. Appl. No. 12/931,562, Bethea.

(Continued)

*Primary Examiner* — Justin Larson
(74) *Attorney, Agent, or Firm* — Livingston Loeffler, P.A.; Edward M. Livingston, Esq.; Bryan L. Loeffler, Esq.

(57) ABSTRACT

A protective case (1) for electronic devices (5) having a slidable and pivotally attached lid (2) on a raised rear portion (13) of the protective case that covers a storage compartment (2). An attachment accessory (4), such as a finger grip (27) is located on a rear surface (23) of the lid. The lid may be flipped over to reveal a smooth front surface (22) for when an individual wants to carry the protective case and electronic device in his or her pocket or to reveal the rear surface and attachment accessory for attaching the protective case to the individual's fingers or to a flat surface.

19 Claims, 3 Drawing Sheets

(56) References Cited

U.S. PATENT DOCUMENTS

| | | | |
|---|---|---|---|
| 8,857,691 B2* | 10/2014 | Monaco et al. | 224/669 |
| 8,942,773 B2* | 1/2015 | Wu | 455/575.8 |
| 8,967,377 B2* | 3/2015 | Lebauer | 206/320 |
| 8,978,883 B2* | 3/2015 | Gandhi et al. | 206/45.24 |
| 2003/0157958 A1 | 8/2003 | Bamber | 455/550 |
| 2004/0013279 A1 | 1/2004 | Takeda | 381/312 |
| 2006/0279098 A1 | 12/2006 | Shipley et al. | |
| 2007/0057004 A1* | 3/2007 | Butler et al. | 224/669 |
| 2009/0090750 A1 | 4/2009 | Alcenat | 224/101 |
| 2010/0116387 A1 | 5/2010 | Channey et al. | 150/165 |
| 2010/0203924 A1 | 8/2010 | Hirota | 455/566 |
| 2010/0222118 A1 | 9/2010 | Interdanato | 455/575.6 |
| 2010/0227655 A1 | 9/2010 | Takabayashi | 455/575.3 |
| 2010/0264182 A1 | 10/2010 | Perlman et al. | 224/409 |
| 2011/0034221 A1 | 2/2011 | Hung et al. | 455/575.8 |
| 2011/0065480 A1 | 3/2011 | Kim et al. | 455/566 |
| 2011/0266316 A1 | 11/2011 | Ghalib et al. | 224/217 |
| 2012/0031937 A1 | 2/2012 | Baker | |
| 2012/0106054 A1* | 5/2012 | Royz et al. | 361/679.3 |
| 2012/0261930 A1 | 10/2012 | Bethea | |
| 2012/0267402 A1 | 10/2012 | Beatty | |
| 2012/0299318 A1 | 11/2012 | Murphy et al. | 294/25 |
| 2012/0305445 A1 | 12/2012 | Hu | |
| 2012/0319414 A1 | 12/2012 | Potter et al. | |
| 2013/0299365 A1* | 11/2013 | McCurdy | 206/37 |
| 2014/0135080 A1* | 5/2014 | Kimball et al. | 455/575.1 |
| 2014/0216976 A1* | 8/2014 | Conarro | 206/525 |
| 2014/0228082 A1* | 8/2014 | Morrow et al. | 455/575.8 |
| 2014/0263939 A1* | 9/2014 | Rinner | 248/688 |

OTHER PUBLICATIONS runaroundtech.com (Jan. 16, 2013).
accessoriesforapple.net (Jan. 16, 2013).
theaccessoryking.com (Jan. 16, 2013).
productpilot.com (Jan. 16, 2013).
luuux.com (Jan. 16, 2013).

\* cited by examiner

PROTECTIVE CASE FOR ELECTRONIC DEVICES

CROSS-REFERENCE TO RELATED APPLICATIONS

This application is a continuation-in-part of application Ser. No. 13/943,917, filed on Jul. 17, 2013, which is currently pending and is a continuation-in-part of application Ser. No. 13/135,287, filed on Jul. 1, 2011, which issued as U.S. Pat. No. 8,676,279 on Mar. 18, 2014. The patent applications identified above are incorporated herein by reference in their entirety to provide continuity of disclosure.

FIELD OF THE INVENTION

This invention relates to protective cases for electronic devices, a device for finger(s) attachment to electronic devices and/or a mounting device for electronic devices all of which may be separate combinable and/or interchangeable. The protective case preferably has a raised rear portion that that provides space for a recess to accommodate a holding portion, such as a finger(s) attachment and/or other accessories within the protective case.

BACKGROUND OF THE INVENTION

Cell phones and various other electronic devices are in wide use around the world. When a cell phone is used to answer a call, send a text message and/or view the Internet, it is gripped in the individual's hand or hands. The individual then uses his or her thumbs and fingers to navigate various applications on the phone. However, the movement of the individual's hands and fingers can cause the individual to accidentally drop the phone thereby causing damage to the phone.

An additional problem occurs with extended use of electronic devices causing hand, limb and back problems due to the physical stress of griping the electronic device during use.

Additional uses of smart phones and tablets is for watching videos, listening to music and receiving GPS coordinates and directions in automobiles. The electronic device needs to be held in an individual's hands when using the device for these purposes, rested on a lap, dashboard, console and so forth, thereby leaving the device unsecured and open to damage if the device falls.

Therefore, a need exists for a protective case and/or holding portion with an attachment accessory that provides a secure attachment to either an individual's hand or to a surface to ensure the device will not be dropped and damaged. In addition, a need exists for a protective case with a raised portion, storage compartment and lid to store the attachment accessory within the protective case when not in use.

SUMMARY OF THE INVENTION

The primary object of the present invention is to provide protective case that provides an attachment accessory to attach the protective case to either an individual's hand or fingers to a surface to ensure the electronic device will not be dropped and damaged.

An additional object of the present invention is to provide a protective case with a raised portion, storage compartment and lid to store the attachment accessory within the protective case when the attachment accessory is not in use.

The primary object of the present invention is to provide protective case that provides an attachment accessory that reduces the physical stress of gripping an electronic device.

The present invention fulfills the above and other objects by providing a protective case for mobile electronic devices, such as smart phones, tablets and so forth, having various attachments that allow the electronic device to be held securely in an individual's hand or fingers, mounted to a surface and/or carried via a belt clip. The protective case preferably has a raised rear portion that extends a predetermined distance from the phone to allow space for a slidable hinged lid on the raised rear portion of the protective case that covers a storage compartment. An attachment accessory is located on a rear surface of the lid. The lid may be flipped over to reveal a smooth front surface for when an individual wants to carry the protective case and electronic device in his or her pocket or to reveal a rear surface and the attachment accessory for attaching the protective case to the individual's fingers or to a flat surface.

When the lid is in a partially open position, the lid may be locked into place and used as a stand or "kickstand" on a flat surface to hold the protective case and electronic device in a vertical position or in a horizontal position The above and other objects, features and advantages of the present invention should become even more readily apparent to those skilled in the art upon a reading of the following detailed description in conjunction with the drawings wherein there is shown and described illustrative embodiments of the invention.

BRIEF DESCRIPTION OF THE DRAWINGS

In the following detailed description, reference will be made to the attached drawings in which.

DESCRIPTION OF THE PREFERRED EMBODIMENTS

Figure 1:
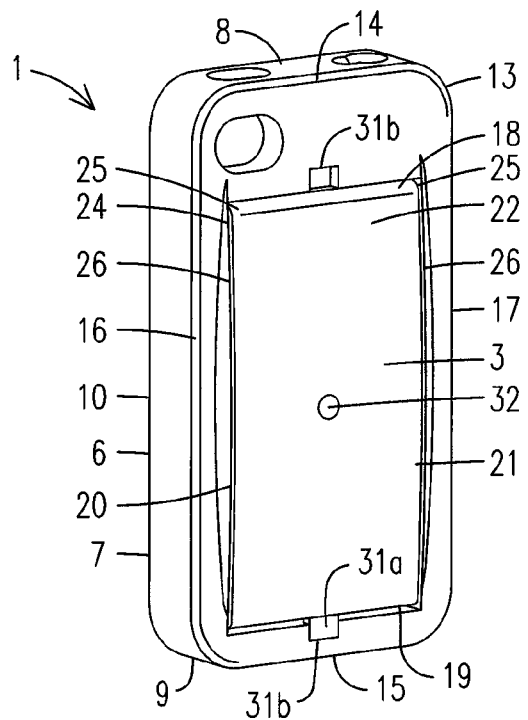
FIG. 1 is a rear perspective view of a protective case of the present invention with the lid in a closed position and the front surface of the lid in an upward position.

For purposes of describing the preferred embodiment, the terminology used in reference to the numbered accessories in the drawings is as follows:

1. protective case, generally
2. storage compartment
3. sliding lid
4. attachment accessory
5. electronic device
6. front portion of protective case
7. holding means
8. top wall of holding means
9. bottom wall of holding means
10. first side wall of holding means
11. second side wall of holding means
12. middle wall of protective case
13. rear portion of protective case
14. top wall of raised rear portion
15. bottom wall of raised rear portion
16. first side wall of raised rear portion
17. second side wall of raised rear portion
18. top edge of lid
19. bottom edge of lid
20. first side edge of lid
21. second side edge of lid
22. front surface of lid
23. rear surface of lid
24. projection
25. top corner of lid
26. elongated slot
27. finger grip
28. finger indentation
29. front surface of finger grip
30. strap
31a. latch
31b. latch holding means
32. rotation means
33. stop With reference to FIGS. 1-5, the protective case 1 for mobile electronic devices 5, such as smart phones, tablets and so forth, comprises a storage compartment 2 covered by a rotating and sliding lid 3 for storing various attachment accessories 4 that allow the electronic device 5 to be held securely in an individual's hand, mounted to a surface and/or carried via a clip. The protective case 1 is preferably substantially rectangular-shaped and comprises a front portion 6 having a holding means 7 for holding an electronic device 5 within the protective case 1. The holding means 7 preferably comprises a top wall 8, a bottom wall 9, a first side wall 10, a second side wall 11 and a middle wall 12 separating the front portion 6 from a raised rear portion 13. The holding means 7 may also comprise a sleeve, one or more clip and so forth for holding the electronic device 5 within the carrying case 1.

The raised rear portion 13 comprises a top wall 14, bottom wall 15, a first side wall 16 and a second side wall 17 extending a predetermined distance from the middle wall 12 to allow space for the storage compartment 2. The rotating and sliding lid 3 comprises a preferably rectangular-shaped planar piece of material that covers the storage compartment 2. Said lid 3 comprises a top edge 18, bottom edge 19, first side edge 20, second side edge 21, front surface 22 and rear surface 23. Projections 24 are located at top corners 25 of the lid 2. Said projections 24 engage elongated slots 26 located along the first side wall 16 and second side wall 17 of the raised rear portion 13. Said lid 3 is pivotally connected to the first side wall 16 and second side wall 17 in a manner that allows the top edge 18 of the lid 4 to be slid lengthwise from a location proximal to the top wall 14 of the raised rear portion 13 to a location proximal to the bottom wall 15 of the raised rear portion 13.

Figure 2:
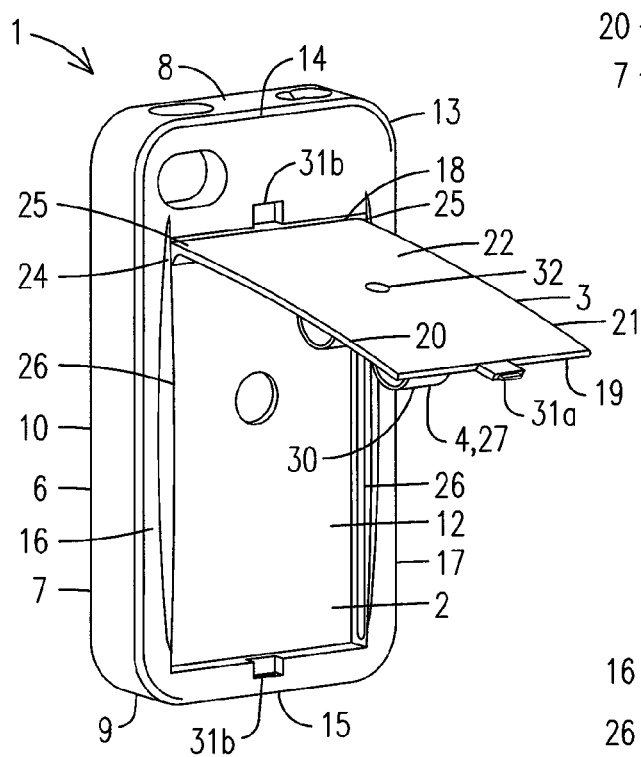
FIG. 2 is a rear perspective view of a protective case of the present invention with the lid in a partially open position with the top edge of the lid located proximal to the top wall of the raised rear portion and the front surface of the lid in an upward position.

When the top edge 18 of the lid 2 is in a location proximal to the top wall 14 of the raised rear portion 13, the lid 2 may be folded downward into a parallel position with the middle wall 12, thereby covering the storage compartment 2 and exposing the front surface 22 of the lid 2, which is preferably smooth, as illustrated in FIGS. 1 and 2.

Figure 3:
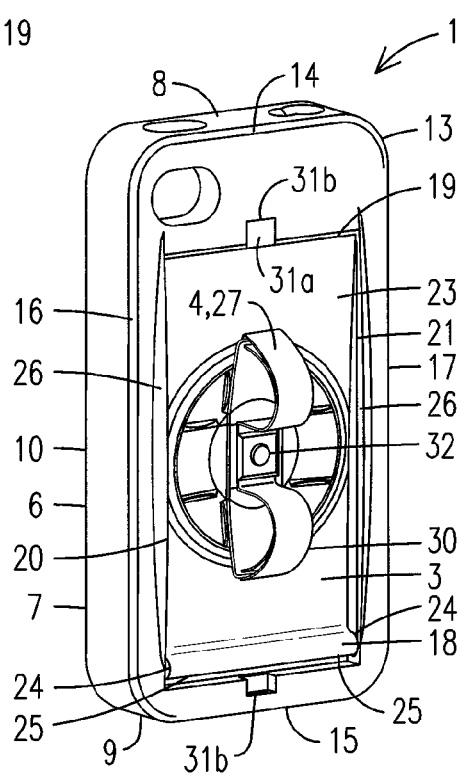
FIG. 3 is a rear perspective view of a protective case of the present invention with the lid in a closed position and the rear surface of the lid in an upward position with an attachment accessory located thereon.
Figure 4:
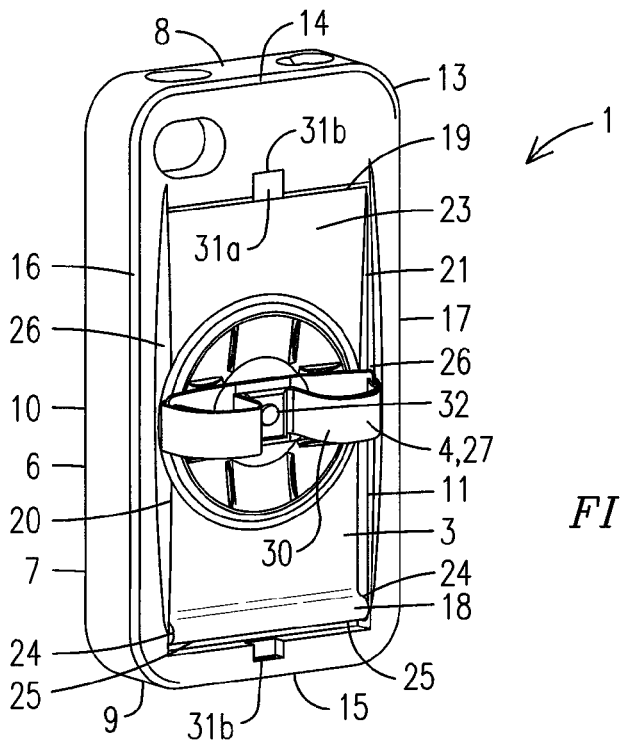
FIG. 4 is a rear perspective plan view of a protective case of the present invention with the lid in a closed position and the rear surface of the lid in an upward position with an attachment accessory located thereon.
Figure 5:
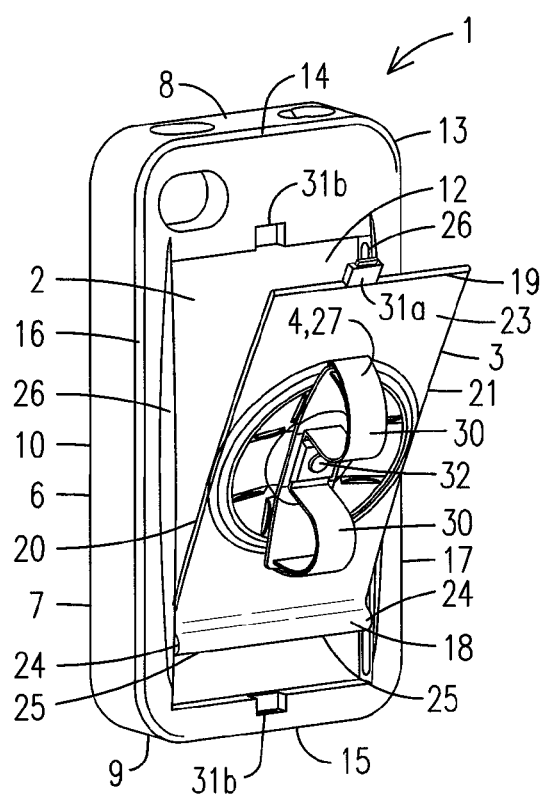
FIG. 5 is a rear perspective view of a protective case of the present invention with the lid in a partially open position with the top edge of the lid located proximal to the bottom wall of the raised rear portion and the rear surface of the lid in an upward position.
Figure 6:
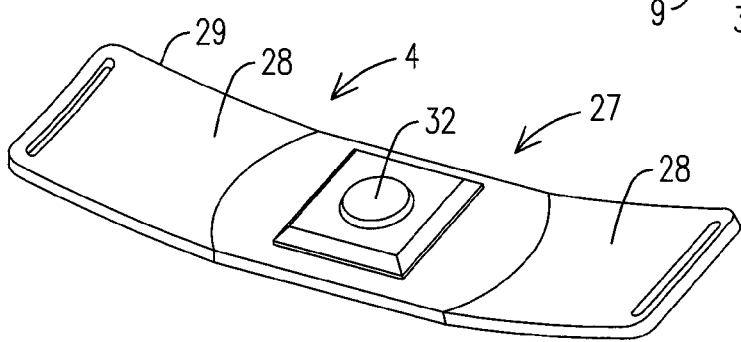
FIG. 6 is a perspective side view of a finger grip of the present invention.

When the bottom edge 19 of the lid 2 is in a location proximal to the bottom wall 14 of the raised rear portion 13, the lid 2 may be folded downward into a parallel position with the middle wall 12, thereby covering the storage compartment 2 and exposing the rear surface 23 of the lid 2, which has an attachment accessory 4 located thereon, as illustrated in FIGS. 3, 4 and 5.

Figure 7:
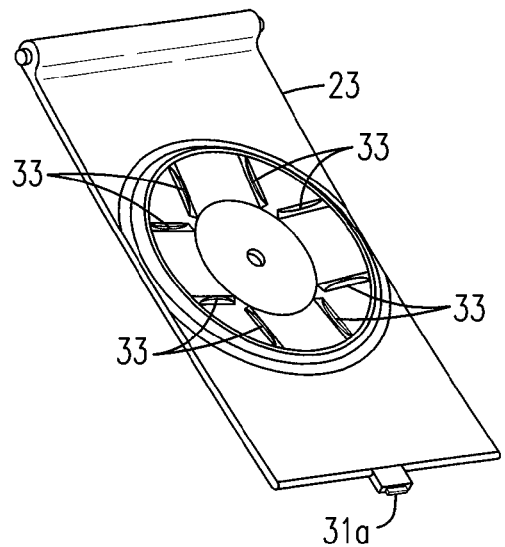
FIG. 7 is a perspective rear view of a lid of the present invention.

The attachment accessory 4 may be a finger grip 27, as illustrated in FIGS. 3, 4, 5 and 6. The finger grip 27 may be curved and have at least two finger indentations 28 located on a front surface 29. One or more straps 30 are located on the finger grip 27 to attach the protective case 1 and electronic device 5 to the individual's fingers. One or more pull tabs 31 are located on the one or more straps 30 to allow a user to easily adjust the length of the one or more straps 31 to the size of his or her fingers. The finger grip 27 is mounted to the rear surface 23 of the lid 2 and capable of being rotated in relation to the lid 2 via a rotation means 32, thereby allowing an individual to turn the protective case 1 and electronic device 5 vertically or horizontally while attached to his or her fingers. As illustrated in FIG. 7, a latch 33a and holding means 33b may be located on the rear surface 23 of the lid 2 to allow the finger grip 27, to be locked in a vertical or horizontal holding position.

Figure 8:
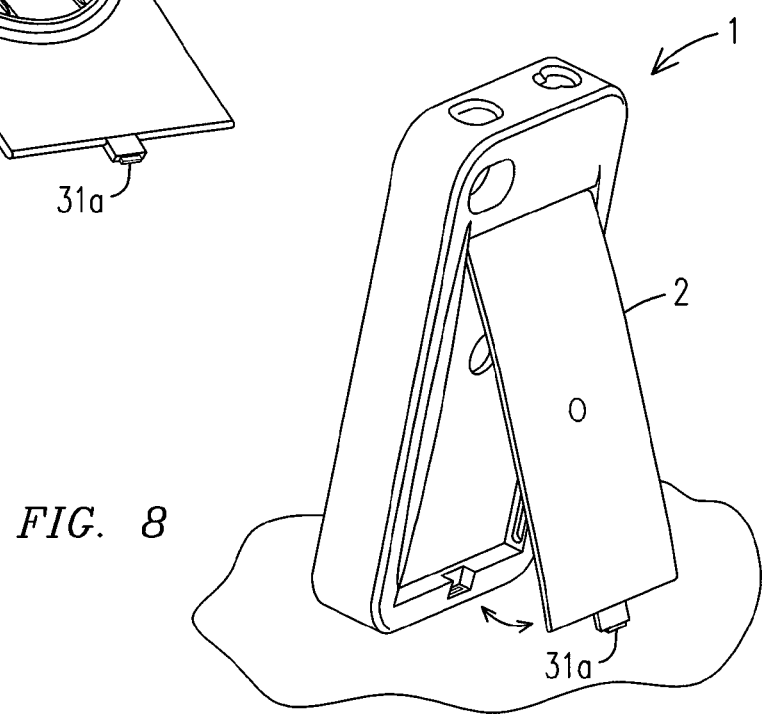
FIG. 8 is a rear perspective view of a protective case of the present invention with the lid in a partially open position being used as a stand on a flat surface to hold the protective case in a vertical position.
Figure 9:
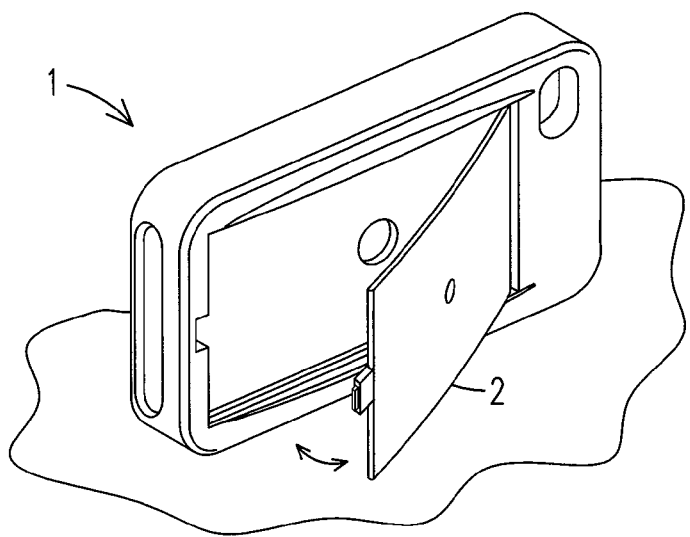
FIG. 9 is a rear perspective view of a protective case of the present invention with the lid in a partially open position being used as a stand on a flat surface to hold the protective case in a horizontal position.

With reference to FIGS. 8 and 9, the lid 2 in a partially open position is illustrated. When the lid 2 is in a partially open position, the lid 2 may be used as a stand on a flat surface to hold the protective case 1 and electronic device 5 in a vertical position, as illustrated in FIG. 8, or in a horizontal position, as illustrated in FIG. 9.

It is to be understood that while a preferred embodiment of the invention is illustrated, it is not to be limited to the specific form or arrangement of parts herein described and shown. It will be apparent to those skilled in the art that various changes may be made without departing from the scope of the invention and the invention is not to be considered limited to what is shown and described in the specification and drawings.

Having thus described my invention, I claim:

1. A protective case for electronic devices comprising:

a front portion separated from a rear portion by a middle wall;

a holding means located on the front portion for holding an electronic device within the protective case;

a raised rear portion extending a predetermined distance from the middle wall;

a storage compartment located within the raised rear portion; and a lid pivotally and slideably attached to the raised rear portion, wherein the lid has a front surface and a rear surface, and wherein the lid is capable of being closed with either of the front and rear surfaces facing outward.

2. The protective case of claim 1 further comprising:
an attachment accessory attached to said lid.

3. The protective case of claim 1 wherein:
said holding means comprises a top wall, a bottom wall, a first side wall, a second side wall all extending from the middle wall a predetermined distance.

4. The protective case of claim 1 wherein:
said lid comprises a preferably rectangular-shaped planar piece of material that covers the storage compartment; and
said lid having a top edge, bottom edge, first side edge, and second side edge.

5. The protective case of claim 1 wherein:
raised rear portion comprises a top wall, bottom wall, a first side wall and a second side wall extending a predetermined distance from the middle wall to allow space for the storage compartment.

6. The protective case of claim 1 further comprising:
projections located at top corners of the lid; and
said projections engage elongated slots located on the raised rear portion of the protective case.

7. The protective case of claim 4 further comprising:
projections located at top corners of the lid; and
said projections engage elongated slots located along the first side wall and second side wall of the raised rear portion of the protective case.

8. The protective case of claim 2 wherein:
said attachment accessory is a finger grip.

9. A protective case for electronic devices comprising:
a front portion separated from a rear portion by a middle wall;
a holding means located on the front portion for holding an electronic device within the protective case;
a raised rear portion extending a predetermined distance from the middle wall;
a storage compartment located within the raised rear portion;
a lid pivotally and slideably attached to the raised rear portion, wherein the lid has a front surface and a rear surface, and wherein the lid is capable of being closed with either of the front and rear surfaces facing outward; and
an attachment accessory attached to said lid.

10. The protective case of claim 9 wherein:
said holding means comprises a top wall, a bottom wall, a first side wall, a second side wall all extending from the middle wall a predetermined distance.

11. The protective case of claim 9 wherein:
said lid comprises a preferably rectangular-shaped planar piece of material that covers the storage compartment; and
said lid having a top edge, bottom edge, first side edge, and second side edge.

12. The protective case of claim 9 wherein:
raised rear portion comprises a top wall, bottom wall, a first side wall and a second side wall extending a predetermined distance from the middle wall to allow space for the storage compartment.

13. The protective case of claim 9 further comprising:
projections located at top corners of the lid; and
said projections engage elongated slots located on the raised rear portion of the protective case.

14. The protective case of claim 12 further comprising:
projections located at top corners of the lid; and
said projections engage elongated slots located along the first side wall and second side wall of the raised rear portion of the protective case.

15. The protective case of claim 9 wherein:
said attachment accessory is a finger grip.

16. A protective case for electronic devices comprising:
a front portion separated from a rear portion by a middle wall;
a holding means located on the front portion for holding an electronic device within the protective case;
a raised rear portion extending a predetermined distance from the middle wall;
a storage compartment located within the raised rear portion;
a lid pivotally and slideably attached to the raised rear portion, wherein the lid has a front surface and a rear surface, and wherein the lid is capable of being closed with either of the front and rear surfaces facing outward;
an attachment accessory attached to said lid;
said raised rear portion comprises a top wall, bottom wall, a first side wall and a second side wall extending a predetermined distance from the middle wall to allow space for the storage compartment;
projections located at top corners of the lid; and
said projections engage elongated slots located on the raised rear portion of the protective case.

17. The protective case of claim 16 wherein:
said holding means comprises a top wall, a bottom wall, a first side wall, a second side wall all extending from the middle wall a predetermined distance.

18. The protective case of claim 16 wherein:
said lid comprises a preferably rectangular-shaped planar piece of material that covers the storage compartment; and
said lid having a top edge, bottom edge, first side edge, and second side edge.

19. The protective case of claim 16 wherein:
said attachment accessory is a finger grip.

* * * * *